| United States Patent [19] | [11] Patent Number: 4,520,321 |
|---|---|
| Nakatsugawa et al. | [45] Date of Patent: May 28, 1985 |

[54] PHASE DIFFERENCE DETECTOR WITH PHASE INVERSION OF ONE INPUT SIGNAL WHEN PHASE DIFFERENCE IS SMALL

[75] Inventors: Kenji Nakatsugawa; Hiroshi Itaya, both of Tokyo, Japan

[73] Assignee: Anritsu Electric Company Limited, Tokyo, Japan

[21] Appl. No.: 445,643

[22] Filed: Nov. 30, 1982

[30] Foreign Application Priority Data

Nov. 30, 1981 [JP] Japan .................................. 56-191972

[51] Int. Cl.³ ........................ G01R 25/00; H03K 5/22
[52] U.S. Cl. .................................... 328/133; 307/262; 307/511; 307/513; 307/529; 328/26; 331/25
[58] Field of Search ............... 307/511, 513, 514, 529, 307/351, 360, 262, 269; 328/26, 55, 109, 133; 331/17, 25; 375/119, 120

[56] References Cited

U.S. PATENT DOCUMENTS

| 4,105,947 | 8/1978 | Crowley | 307/511 X |
|---|---|---|---|
| 4,119,910 | 10/1978 | Hayashi | 328/133 X |
| 4,157,500 | 6/1979 | Nicoli | 328/133 X |
| 4,228,368 | 10/1980 | Orban | 307/511 X |
| 4,267,514 | 5/1981 | Kimsey | 328/133 |
| 4,431,969 | 2/1984 | Summers et al. | 307/262 X |

*Primary Examiner*—Stanley D. Miller
*Assistant Examiner*—D. R. Hudspeth
*Attorney, Agent, or Firm*—Jordan and Hamburg

[57] ABSTRACT

A phase detector is disclosed in which means are provided for sensing when two AC signals being subjected to phase difference measurement become close in phase, within a predetermined range, and for inverting one of these signals in phase when such a close phase relationship is sensed. The phase difference between the phase inverted signal and the other signal is then measured, and compensation is applied to the measured results such as to compensate for the effects of the phase inversion operation. Insensitivity and "hunting" effects which occur with prior art phase detectors in the region of zero phase difference are thereby eliminated, and an output signal can be obtained which varies in a smooth and continuous manner with variations in the phase difference between the two signals under measurement, over a 360° range.

5 Claims, 7 Drawing Figures

PHASE DIFFERENCE DETECTOR WITH PHASE INVERSION OF ONE INPUT SIGNAL WHEN PHASE DIFFERENCE IS SMALL

BACKGROUND OF THE INVENTION

The present invention relates to a phase detector, for measuring the phase difference between two alternating current (hereinafter abbreviated to AC) signals, and for producing an output signal indicative of the value of that phase difference. More specifically, the present invention relates to a phase detector which will provide an output signal representing the phase difference between two AC signals, which varies in a smooth and continuous over the entire measurement range, i.e. over a range of phase difference coverings 360°, and which will precisely and accurately indicate phase differences in the region of 0°.

Various types of circuit have been proposed and utilized in the prior art for detecting and measuring the phase difference between a pair of AC signals. However it has proven difficult to provide simple and effective means for ensuring that accurate phase difference will be carried out for phase differences in the region of 0°. This is due to the fact that a phase difference of 0° is equivalent to a phase difference of 360°, so that if, for example, such a prior art phase detector produces an output signal in the form of a voltage whose level varies in proportion to the phase difference between two AC signals, then this voltage will increase to a maximum value as the phase difference approaches 360°, and then must immediately return to a minimum value when the phase difference reaches and exceeds 360°, i.e. returns to 0°. This requirement for a step discontinuity in the output signal from such a prior art phase detector results in a jitter or "hunting" effect when the phase difference approaches a value in the region of 0° (i.e. 360°), which results in detection insensitivity and inaccuracy within that region.

For this reason, although it has been found possible in the prior art to produce phase detectors which are simple in configuration and substantially accurate over most of the range of phase difference measurement, such phase detectors have the defect of having a region of insensitivity in the region of 0° phase difference. This disadvantage is overcome with a phase detector according to the present invention, which will provide a smoothly and continuously varying output signal over the complete 360° phase difference measurement range, without a region of hunting and insensitivity close to a phase difference of 0°.

SUMMARY OF THE INVENTION

A phase detector according to the present invention for measuring the phase difference between two AC signals, basically comprises a phase inverter circuit, which is controllable for either transferring one of the AC signals directly therethrough or for inverting the phase of that AC signal, a phase measurement circuit which is coupled to receive the other AC signal and the output signal from the phase inverter circuit, and an operation processing circuit, together with a phase inversion control circuit. The phase inversion control circuit acts to detect whether the phase difference between the two signals input to the phase difference measurement circuit is close to zero (more specifically, whether that phase difference is within a predetermined range which includes the 0° phase difference). If this condition is detected, then the phase inversion control circuit produces a control signal which causes the phase inverter circuit to perform phase inversion of the AC signal input thereto, before transferring that signal to be input to the phase difference measurement circuit. If the phase difference between the signals input to the phase difference measurement circuit is outside the predetermined range referred to above, then the output signal from the phase inversion control circuit causes the phase inverter circuit to transfer the AC signal input thereto directly to be input to the phase difference measurement circuit. In this way, when the phase difference between the two AC signals undergoing phase phase difference measurement is, for example, 180°, then an output signal will be produced from the phase difference measurement circuit representing a phase difference of 180°, in the form of an analog or digital value. When the phase difference between the two AC signals reaches 0°, then the output signal from the phase difference measurement circuit will again indicate a phase difference of 180°, as a result of the phase inversion being produced by the phase inverter circuit. However, the latter condition of the phase difference measurement circuit output signal can be distinguished from the case in which the phase difference between the two AC signals is actually 180°, by the fact that a control signal designating phase shift operation by the phase inverter circuit is being produced. On the basis of the latter information, the operation processing circuit operates on the output signal from the phase difference measurement circuit in such a manner as to compensate for the effect of the phase inversion produced by the phase inverter circuit, e.g. by addition or subtraction of a fixed amount, by analog or digital processing. This will be made more apparent in the description of the preferred embodiment.

In order to prevent "hunting" instability, and therefore insensitivity and inaccuracy, when changeover occurs between the phase inverter circuit being operative and non-operative, hysteresis is provided in the operation whereby the phase inversion control circuit senses the output signal from the phase difference measurement circuit to control the operation of the phase inverter circuit. As a result, a phase detector according to the present invention produces an output signal which provides a smooth and continuous variation to represent the phase difference between two AC signals, over the entire 360° range of measurement, without the introduction of hunting effects or regions of detection insensitivity.

DESCRIPTION OF THE PREFERRED EMBODIMENTS

Figure 1:
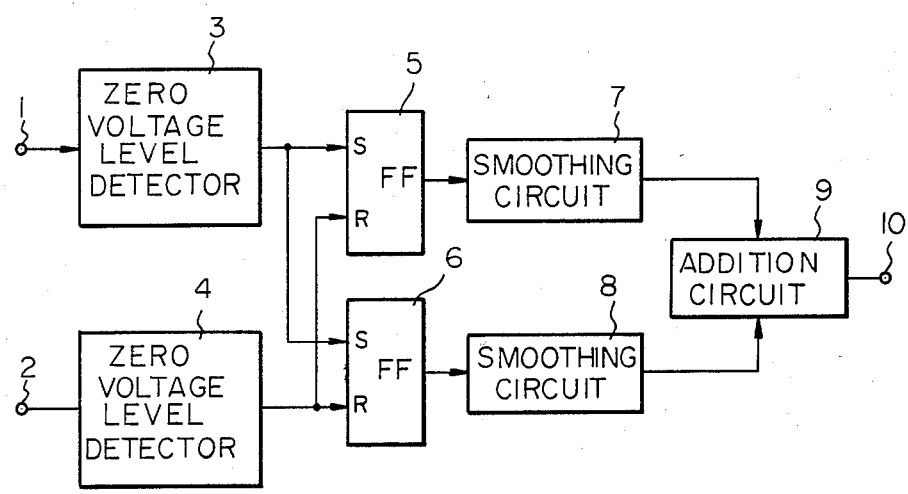
FIG. 1 is a simplified block circuit diagram of a phase detector according to the prior art.

Referring now to the drawings, FIG. 1 is a simplified block circuit diagram of a phase detector circuit which is known in the prior art, used to measure the phase difference between two AC signals. These AC signals are applied to input terminals 1 and 2 respectively of zero voltage level detectors 3 and 4. The output terminal of zero voltage level detector 3 is connected to the set terminals S of a pair of flip-flops 5 and 6, while the output of zero voltage level detector 4 is connected to the reset terminals R of flip-flops 5 and 6. Each of the zero voltage level detectors 3 and 4 has the property of producing an output signal which remains at a low logic level potential (hereinafter abbreviated to L level) so long as the input signal applied thereto is below a threshold level of zero volts, and which rises to a high logic level potential (hereinafter abbreviated to H level) when the input signal applied thereto rises above that zero volts threshold level. Flip-flop 5 functions such as to be set, thereby producing an output signal at the H level, in response to a voltage transition from the L level to the H level at the S terminal, and to be reset, thereby producing an output signal at the L level, in response to a transition from the L level to the H level of a signal applied to the reset terminal R, i.e. flip-flop 5 is a positive-edge triggered type. Flip-flop 6 is a negative-edge triggered type, i.e. which is set in response to an H-to-L level transition of the signal applied to the S terminal, and reset by an H-to-L level transition of the signal applied to the reset terminal R. The output signals from flip-flop (hereinafter abbreviated to FF) 5 and 6 are input to smoothing circuits 7 and 8 respectively, to thereby produced DC signal voltages whose levels are determined by the phase difference between the input AC signals being subjected to phase difference measurement. These DC signals are added in an addition circuit 9, to thereby produce an output signal on terminal 10 which corresponds to the sum of the output voltages from smoothing circuits 7 and 8.

Figure 2:
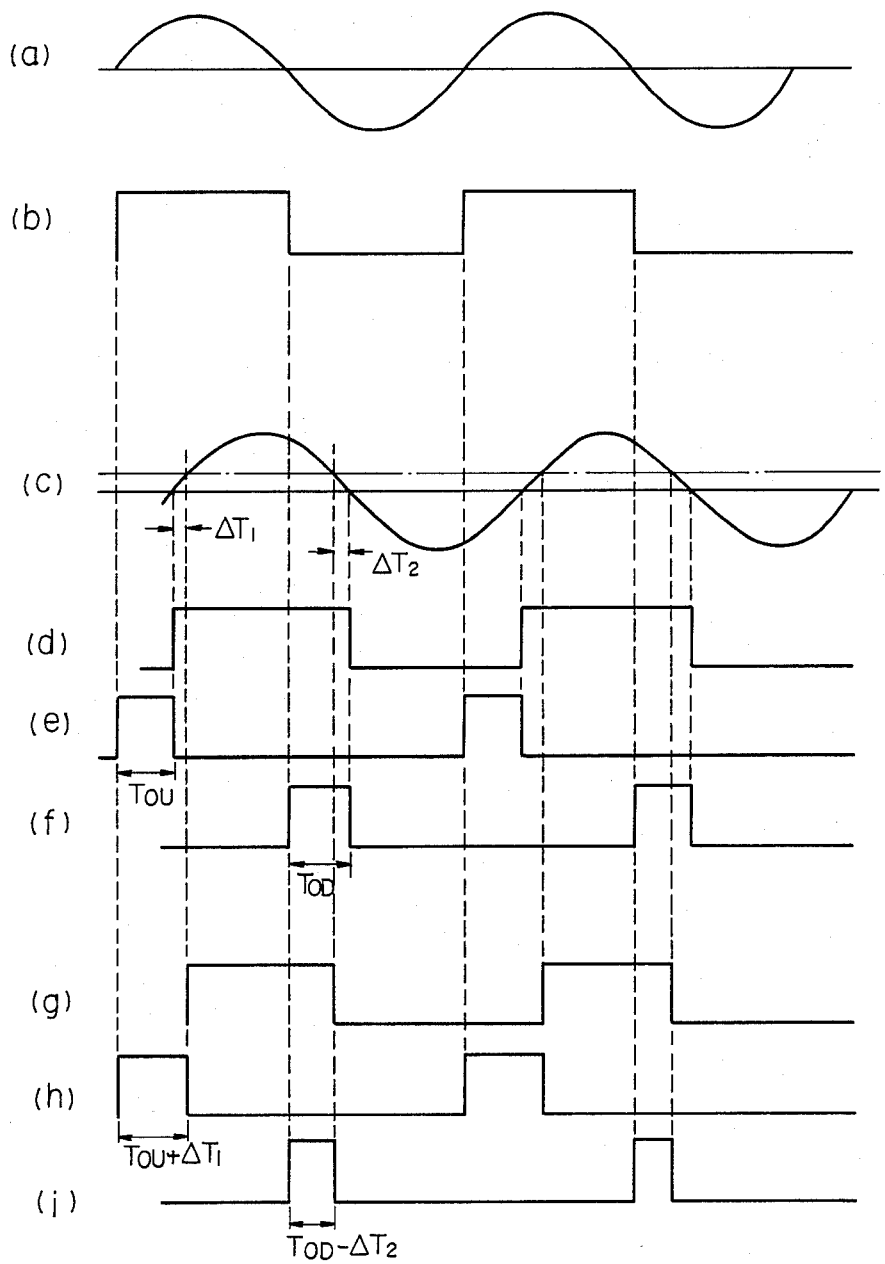
FIG. 2 is a timing diagram for assistance in describing the operation of the phase detector of FIG. 1.

The operation of this phase detector circuit will now be described with reference to the timing diagram of FIG. 2. FIG. 2a and FIG. 2c illustrate the waveforms of the AC signals applied to input terminals 1 and 2 respectively. FIG. 2b and FIG. 2d show the waveforms of the corresponding output signals produced by zero voltage level detectors 3 and 4 respectively. FIG. 2e and FIG. 2f show the pulse trains which are produced as output signals from FFs 5 and 6 respectively. As shown, each pulse produced by FF 5 has a pulse width Tou, which represents the difference in timing between the point at which the AC signal applied to input terminal 1 rises above the zero voltage threshold level and the point at which the AC signal applied to input terminal 2 rises above that threshold level. Similarly, the pulse width of each of the pulses produced by FF 6, i.e. Tod, corresponds to the difference between the timings at which the AC signal applied to input terminal 1 falls below the zero voltage threshold and the point at which the AC signal applied to input terminal 2 falls below that threshold. Thus the pulse widths TOu and Tod vary in proportion to the phase difference between the AC signals applied to input terminals 1 and 2. Thus, the DC signals produced by smoothing the pulse trains output from FFs 5 and 6 will vary in proportion to the phase difference between the AC signals applied to input terminals 1 and 2, and so therefore does the output signal from addition circuit 9.

Such a phase detector circuit inherently compensates for small deviations in the threshold levels of zero voltage level detectors 3 and 4. If for example the threshold level of zero voltage level detector 3 should vary by an amount $\Delta V$, so that this threshold level now corresponds to the chain line shown in FIG. 2c, then timing of the output pulses from zero voltage level detector 3 will become as shown in FIG. 2g, with the leading edge of each pulse being shifted in phase by an amount $\Delta T1$ and the falling edge of each pulse being shifted by an amount $\Delta T2$, as shown. As a result, the pulse width of the output pulses from FF 5 will become as shown in FIG. 2h, i.e. the pulse width will become (Tou+$\Delta T1$), so that the pulse width is increased by $\Delta T1$. Similarly, the pulse width of the output pulses from FF 6 will become as shown in FIG. 2i, i.e. equal to (Tod−$\Delta T2$). If the AC signals applied to input terminals 1 and 2 are both sinusoidal, then the pulse width deviations $\Delta T1$ and $\Delta T2$ will be equal to one another, so that the resultant changes in the levels of the output signals from smoothing circuits 7 and 8 will mutually compensate. Thus, the level of the output signal voltage from addition circuit 9 will not be affected by a minor deviation in the threshold level of zero voltage level detector 3.

Figure 3:
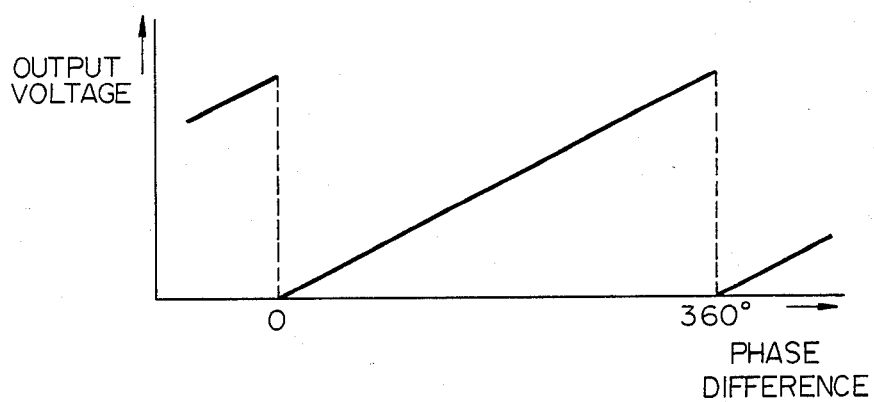
FIG. 3 is a diagram for illustrating the relationship between measured phase difference and an output signal, for the example of FIG. 1.

Such a phase detector circuit however has a basic disadvantage, as will now be described with reference to FIG. 3. In FIG. 3, the relationship between the output voltage produced from terminal 10 of the phase detector circuit of FIG. 1 and the phase difference between the AC signals applied to input terminals 1 and 2 is shown. This output voltage reaches a minimum valve when these AC signals come into phase coincidence, i.e. reach a phase difference of 0°, and linearly increases to reach a maximum value when the phase difference reaches 360°. Since a phase difference of 360° is equivalent to a phase difference of 0°, the output voltage must then rapidly fall to the minimum value. However due to the limitations of practical circuit elements, the output voltage from terminal 10 will not switch precisely between the maximum and minimum values when a phase difference of 0° or 360° is reached, but instead will "hunt" or fluctuate erratically between the maximum and minimum levels. This results in a region of phase difference detection insensitivity close to a phase difference of 0°. This region of insensitivity is a serious disadvantage of such a prior art phase detector circuit, and prevents an accurate indication being provided of the point at which the AC signals applied to input terminals 1 and 2 come into phase coincidence.

Figure 4:
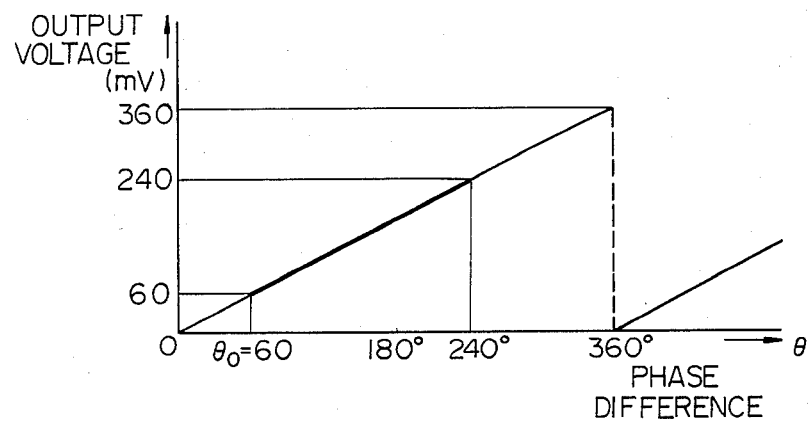
FIG. 4 is a diagram for assistance in describing the relationship between phase detector output voltage and phase difference, with a phase detector according to the present invention.

An embodiment of a phase detector according to the present invention will now be described, with the basic principles of operation of such a phase detector being first described with reference to FIGS. 4, 5 and 6. As described above, a prior art phase detector of the form shown in FIG. 1 is capable of performing accurate phase difference measurement except in the case of phase differences which lie within a range close to 0°. In the following, the phase difference between the AC signals applied to input terminals 1 and 2 will be denoted as $\theta$. A specific value of phase difference $\theta$, denoted as $\theta o$, is selected, having some suitable value within the range 0° to 180°. The value $\theta o$, referred to in the following as the primary phase difference, has a value of 60° in the present embodiment. When the phase difference between the AC signals undergoing phase measurement has increased from this primary phase difference) $\theta o$ by 180°, i.e. to a value of 240° for the present embodiment, then one of the two AC signals is forcibly shifted in phase by 180°, i.e. the phase difference between the two AC signals is shifted by 180°. As a result, the phase difference between the inverted AC signal and the other AC signal is now being measured, i.e. a phase difference of 60°. If the phase difference is assumed to continue increasing, until a value of 240° is again reached, then phase inversion of one of the AC signals by 180° is once more carried out, so that measurement of a true phase difference of 60° is once more being performed. This is illustrated in FIG. 4, in which it is assumed that the phase detector output voltage increases by 1 mV for each increase of phase difference by 1°. It can thus be understood that with such a method, phase difference measurement is only performed within a limited region, e.g. in this case from 60° to 240°, so that the region of detection insensitivity around 0° is avoided.

In FIG. 4 and the above description, phase difference has been assumed to be measured as an absolute value, within the range 0° to 360°. However phase difference is more generally represented in the form $-180° \leq \theta \leq +180°$, i.e. with a sign attached. Representing $\theta$ in this way, the relationship between $\theta$ and the output voltage from a phase difference measurement circuit 18 shown in FIG. 4 and described hereinafter will be basically as shown in FIG. 5. In FIG. 5, the range of phase difference $\theta$ from 60° to 180°, together with the range from $-180°$ to $-120°$, correspond to the range of 60° to 240° phase difference shown in FIG. 4 for the case of no forcible 180° phase shift being applied to the AC signals being measured. The range of phase difference from $-120°$ to $+60°$ in FIG. 5 corresponds to a repetition of the range from 60° to 240° shown in FIG. 4, with the phase of one of the AC signals under measurement being inverted. Thus as shown the step change in output voltage which occurs with a prior art phase detector in the region of 0° phase difference is eliminated, so that no region of detection insensitivity is produced around 0°.

Figure 5:
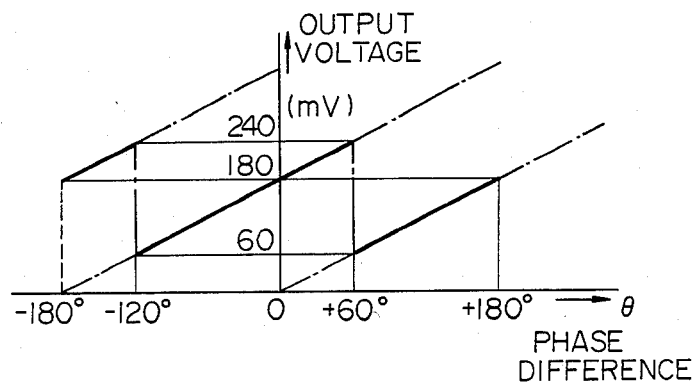
FIG. 5 and FIG. 6 are diagrams for illustrating the relationship between the output voltage from a phase difference measurement circuit and measured phase difference, for an embodiment of a phase detector according to the present invention.

However as can be seen in FIG. 5, step changes in the phase detector output voltage will occur at phase difference values of $-120°$ and $+60°$. Such rapid transitions of the phase detector output voltage will result in "hunting" being produced, which will result in regions of detection insensitivity. In order to eliminate such regions, hysteresis is introduced into the phase detector operation, as will now be described with reference to FIG. 6. To produce this hysteresis, a specific value of phase difference, referred to as the phase difference increment value, is utilized. This differs from the primary phase difference $\theta o$ by a fixed amount. In the present embodiment, the phase difference increment value is made 30°, which differs from the primary phase difference $\theta o$ by 30°. The difference between the primary phase difference and the phase difference increment value determines the degree of hysteresis which is produced. If the phase detector is assumed to be operating in the condition in which no forcible 180° phase shift of one of the AC input signals is being performed, with the phase difference between the AC input signals increasing towards the $-120°$ value, then changeover takes place from a condition of no 180° phase shifting of the input AC signals (at point D) to a condition in which one of the input AC signals is forcibly shifted in phase by 180° (at point D'). At this transition, the phase detector output voltage (or, in this embodiment, the output voltage of phase difference measurement circuit 18 in FIG. 7) changes from 240 mV to 60 mV. If the phase difference continues to increase, in the condition in which 180° phase inversion of one of the input AC signals is being carried out, then an output voltage of 180 mV will be produced when a phase difference of 0° is attained, since the amount of phase difference actually measured by phase difference measurement circuit 18 will be 180° at this time. As the phase difference continues to increase from zero, point C is reached, at which the output voltage again reaches 240 mV, when a transition occurs to point C', with the forcible phase inversion of one of the input AC signals being thereupon terminated. The actual phase difference of 60° between the AC signals is now being measured by the phase difference measureurement circuit 18, and an output voltage of 60 mV is produced thereby. If the phase difference continues to increase thereafter, then the sequence of operations described above will be repeated.

If on the other hand the phase difference is assumed to be decreasing, for example from a value of $+180°$, then no changeover to a condition of input signal phase inversion will take place when a phase difference of 60° is reached, due to the hysteresis which has been provided. However as the phase difference further decreases to 30°, i.e. the phase difference increment value, at point A in FIG. 6, then changeover is performed to the condition in which one of the input AC signals is inverted in phase. As a result, the output voltage from phase difference measurement circuit 18 changes from 30 mV to 210 mV. As the phase difference continues to decrease in this condition, a value of 0° will be reached, with an output voltage of 180 mV being again produced.

As the phase difference continues to decrease to a value of $-120°$, no changeover from the input signal phase inversion condition is performed, due to the hysteresis. However when the phase difference reaches a value of $-150°$, at point B, then changeover is carried out to the operating condition in which no inversion of the phase of the input signals is performed, i.e. to point B', so that the output voltage again rises to 210 mV. Thereafter, if the phase difference continues to decrease, the output voltage will reach 180 mV when the phase difference becomes $-180°$ (equivalent to $+180°$).

It can therefore be understood that the desired hysteresis can be produced by controlling the conditions under which one of the AC input signals under measurement is inverted in phase, in accordance with detection of whether the output voltage produced by the phase difference measurement circuit 18 exceeds 240 mV or less than 30 mV. As a result of this hysteresis, changeover from points A to A', B to B', C to C' and D to D' takes place in a smooth and accurate manner, without hunting being produced, so that regions of detection insensitivity which occur with a prior art phase detector circuit as described hereinabove, are eliminated. In addition, by suitably processing the output signals shown in FIG. 6, as described hereinafter, an output signal can be derived which varies continuously and accurately in accordance with variations in phase difference $\theta$ over the entire range of $-180°$ to $+180°$. As an example of this processing, an output voltage of 180 mV is shown in FIG. 6 as being produced when a phase difference of 0° exists between the AC signals under measurement, with one of these signals being inverted by 180° before phase difference measurement. However if 180 mV is subtracted from the latter output signal, then an output of 0 mV, correctly representing the 0° phase difference will be obtained. Such processing, performed in accordance with whether phase inversion of one of the input AC signals under measurement is being implemented, will be described in greater detail in the following.

Figure 6:
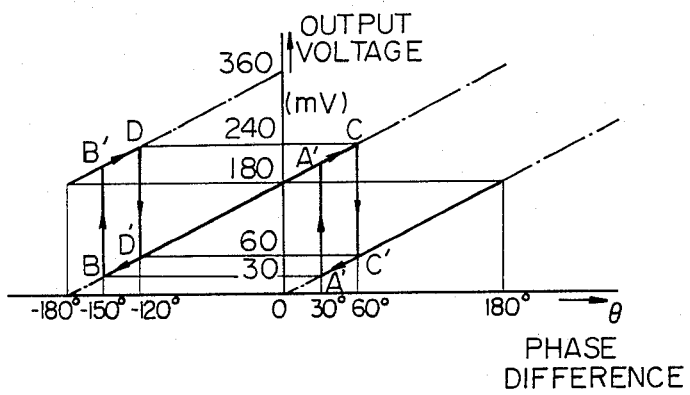
Figure 7:
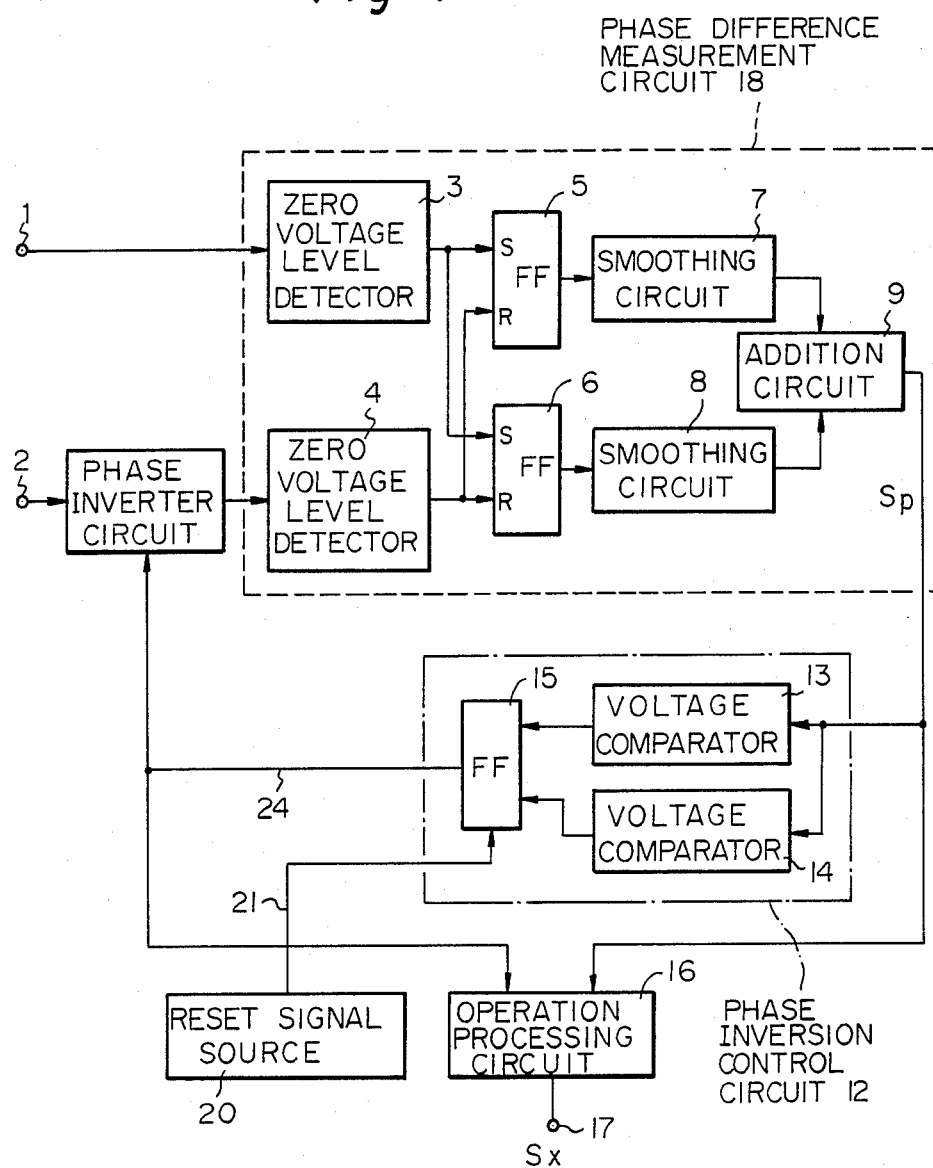
FIG. 7 is a simplified block circuit diagram of a phase detector according to the present invention.

FIG. 7 is a simplified block circuit diagram of an embodiment of a phase detector according to the present invention. Reference numerals 1 to 9 denote terminals and circuit blocks which correspond to those shown in the example of FIG. 1 having identical numerals, and described hereinabove. Numeral 11 denotes a phase inverter circuit which is coupled to terminal 2 for receiving one of the AC signals being subjected to phase detection. Numeral 18 denotes a phase difference measurement circuit whicn in this embodiment is identical to the phase detector circuit shown in FIG. 1. Numeral 12 denotes a phase inversion control circuit numerals 13 and 14 denote voltage comparators, numeral 15 denotes a flip-flop, numeral 16 an operation processing circuit, and numeral 17 is an output terminal. The AC signals being subjected to phase detection are applied to input terminals 1 and 2 respectively. A DC signal representing the phase difference between the AC signal applied to input terminal 1 and the output signal from phase inverter circuit 11 is thereby produced by phase difference measurement circuit 18. The relationship between this output signal, designated in the following as Sp, and the phase difference $\theta$ between the two AC signals being subjected to phase detection, is that illustrated in FIG. 6 and described hereinabove. Output signal Sp is applied over lines 22 to phase inversion control circuit 12 and to operation processing circuit 16. In phase inversion control circuit 12, voltage comparators 13 and 14 serve to compare the output signal voltage Sp from phase difference measurement circuit 18 with an upper threshold voltage (in this embodiment equal to 240 mV, as shown in FIG. 6) and a lower threshold voltage (in this embodiment, 30 mV). When the level of signal Sp exceeds 240 mV then an output signal is produced by voltage comparator 13, which sets FF 15 to thereby produce an output signal, referred to in the following as the phase inversion control signal, at the h logic level. Similarly, when the level of signal Sp from phase difference measurement circuit 18 falls below 30 mV, then an output signal is produced from voltage comparator 14 which also acts to set FF 15 to thereby set the phase inversion control signal to the H level. This phase inversion control signal is applied over line 24 to control the operation of phase inverter circuit 11 and operation processing circuit 16.

In order to initialize the operating state of phase inversion control circuit 12 in relation to the AC signals being subjected to phase detection, for example when these AC signals are first applied or when power is applied to the circuit of FIG. 7, a reset signal is applied to FF 15, to reset that flip-flop and thereby set the phase inversion control signal to the L logic level. Such a reset signal is produced from a reset signal source 20, which may comprise a manually actuated push-button switch, a "power-on" reset signal generating circuit, etc. After such a reset operation has been performed, then phase difference measurement can be initiated.

When the phase inversion control signal is at the L level, then phase inverter circuit 11 simply transfers the AC input signal applied to input terminal 2 directly to the input of zero voltage level detector 4 in phase difference measurement circuit 18. On the other hand, when the phase inversion control signal is at the H level, then phase inverter circuit 11 inverts the phase of the AC signal applied to input terminal 2 by 180°, and applies the inverted signal to zero voltage level detector 4.

The operation processing circuit 16 performs the following operations upon the output signal Sp from phase difference measurement circuit 18, under the control of the phase inversion control signal from phase inversion control circuit 12.

(I) If the phase inversion control signal is at the L logic level while the output signal Sp from phase difference measurement circuit 18 is at a level which is less than 180 mV, then, designating the output signal from operation processing circuit 16 appearing on output terminal 17 as Sx:

$$Sx = Sp$$

In other words, signals Sp is transferred directly to output terminal 17.

(II) If the phase inversion control signal is at the L logic level while the output voltage Sp from phase difference measurement circuit 18 is equal to or greater than 180 mV, then:

$$Sx = (Sp - 360)$$

In other words, 360 mV is subtracted from signal Sp, and the result transferred to output terminal 17.

(III) If the phase inversion control signal is at the H logic level, then:

$$Sx = (Sp - 180)$$

In other words, 180 mV is subtracted from signal Sp and the result is transferred to output terminal 17.

The overall operation of the embodiment of FIG. 7 will now be described. Phase difference measurement operation is initiated by applying a reset signal to FF 15 in phase inversion control circuit 12. As a result, the phase inversion control signal goes to the L level, so that phase inverter circuit 11 is set in the non-operative condition with the AC signal applied to input terminal 2 being transferred directly to zero voltage level detector 4. A voltage whose level represents the phase difference between the AC signals being subjected to phase detection is thereby output as signal Sp from phase difference measurement circuit 18. If this phase difference is within the range 0° to 30°, then the output signal Sp will be within the range 0 to 30 mV, and the phase inversion control signal from FF 15 will go to the H level. As a result, phase inverter circuit 11 will be set in operation, thereby inverting the AC signal applied to input terminal 2, before transfer to zero voltage level detector 4. As a result of this phase inversion, the level of signal Sp from phase difference measurement circuit 18 will be increased by 180 mV, to thereby come within the range 180 mV to 210 mV. Since such a voltage is less than 240 mV and above 30 mV, no output signals will be produced by voltage comparators 13 and 14, so that the phase inversion control signal remains at the H level, and phase inverter circuit 11 continues to perform phase inversion.

If on the other hand the phase difference between the AC signals being subjected to phase detection is within the range 30° to 180° or 180° to 240°, (i.e. the range −180° to −120° as shown in FIG. 6) when phase measurement operation is initiated, then the level of signal Sp from phase difference measurement circuit 18 will be within the range 30 mV to 240 mV. Thus, no output signal will be produced by voltage comparators 13 and 14, and FF 15 will be left in the reset state, so that the phase inversion control signal is held at the L level. Thus, phase inverter circuit 11 is held in the non-operational state, with no inversion of the AC signal applied to input terminal 2 being performed.

If the phase difference between the AC signals being subjected to phase detection is within the range 240° to 360° (i.e. −120° to 0° as shown in FIG. 6), then the output voltage Sp from phase difference measurement circuit 18 will be within the range 240 mV to 360 mV. An output signal will thereby be produced by voltage comparator 13, which sets FF 15 and so causes the phase inversion control signal to go to the H level. Phase inversion of the AC signal applied to input terminal 2 is thereby initiated, so that the level of output signal Sp from phase difference measurement circuit 18 is reduced by 180 mV, i.e. is brought within the range 60 mV to 180 mV. Such a level is above the lower threshold level of 30 mV, so that no output signal is produced by voltage comparators 13 and 14, and the phase inversion control signal is thereby held at the H level, with phase inversion operation by phase inverter circuit 11 being continued.

It can therefore be understood that, immediately after initialization by reset of FF 15 in phase inversion control circuit 12 has been performed, if the phase difference between the AC signals being subjected to phase detection is within the range −120° to +30°, then phase inverter circuit 11 will be set in operation. The AC signal applied to input terminal 2 will thereby be inverted in phase before being transferred to phase difference measurement circuit 18. If on the other hand the phase difference between the AC signals being subjected to phase detection at the moment of reset of FF 15 is within the range +30° to +180°, or within the range −180° to −120°, then phase inverter circuit 11 is not brought into operation, and the AC signal applied to input terminal 2 is transferred directly to phase difference measurement circuit 18 without phase inversion being performed thereon.

It can thus be understood that if the phase difference $\theta$ between the two AC signals being subjected to phase detection is in the region of 0°, then the AC signal applied to input terminal 2 will be inverted before phase detection is performed. Thus, as shown in FIG. 6, the output signal Sp from phase difference measurement circuit 18, i.e. from addition circuit 9 therein, will vary in a smooth and continuous manner about a center value of 180 mV. Thus, hunting of the output signal and resultant regions of detection insensitivity, which occur with prior art phase detection circuits as described hereinabove, are eliminated.

If it is assumed that the phase difference between the two AC signals being subjected to phase detection is decreasing, during and after initialization being performed by reset of FF 15, then when phase difference $\theta$ reaches 30°, comparator 14 will produce an output signal. This causes the phase inversion control signal to go to the H level, so that phase inversion of the AC signal applied to input terminal 2 is performed. As a result, the output voltage Sp from phase difference measurement circuit 18 changes from point A to point A' as shown in FIG. 6. Thus, when the phase difference $\theta$ is in the region of 30° and phase inversion is being performed, the output voltage Sp from phase difference measurement circuit 18 will vary in a smooth and continuous manner, without hunting occurring, due to the hysteresis produced by the operation of phase inversion control circuit 12. Similarly, phase inversion is performed in accordance with this hysteresis at points B and D, for values of phase 150° to −120°.

Thus, as a result of phase difference measurement circuit 18 and phase inverter circuit 11 operating under the control of phase inversion control circuit 12 as described above, to produce an output signal Sp whose level varies with the phase difference $\theta$ between the AC signals being subjected to phase detection as illustrated in FIG. 6 and described hereinabove, and as a result of the operations performed upon output signal Sp to produce output signal Sx from terminal 17, as set out in paragraphs (I) to (III) above, output signal Sx from operation processing circuit 16 varies in a smooth and continuous manner to represent the required phase difference, i.e., in the present embodiment, varies linearly from a value of −180 mV at a phase difference $\theta$ of −180°, to a value of +180 mV at a value of $\theta$ of +180°. Output signal Sx can then be displayed by suitable display means (not shown in the drawings), if required, to indicate phase difference $\theta$ in the form $-180° \leq \theta \leq +180°$.

In the embodiment of FIG. 7, a primary phase difference value of 30°, and hence a secondary phase difference value of 240°, and a phase difference increment value of 30° have been assumed. However, other values can be selected for these, with the limitation that the primary phase difference value must be within the range of greater than 0° to less than 180°.

In addition, in the embodiment described above, the use of analog signals throughout has been assumed. However it is equally possible to employ digital signal processing in such a phase detector. For example, the output signals from smoothing circuits 7 and 8 can be converted into digital form, and addition circuit 9 can comprise a digital adder circuit. The phase inversion control circuit 12 and operation processing circuit 16 can also comprise suitable circuits for performing digital processing.

Although the present invention has been described with reference to a specific embodiment, various changes and modifications to that embodiment may be envisaged which fall within the scope claimed for the present invention, as set out in the appended claims. The above description should therefore be interpreted in a descriptive, and not in a limiting sense.

What is claimed is:

1. A phase detector for measuring a phase difference between a first AC signal and a second AC signal, comprising:
    phase inverter circuit means coupled to receive said second AC signal, for producing an output signal;
    phase difference measurement circuit means coupled to receive said first AC signal and said output signal from said phase inverter circuit means, for producing an output signal representing the phase difference between said first AC signal and said output signal from said phase inverter circuit means;

phase inversion control circuit means coupled to receive said output signal from said phase difference measurement circuit means, for producing a first phase inversion control signal if said output signal represents a phase difference which lies within a predetermined range of phase differences which includes a phase difference of zero, and for producing a second phase inversion control signal if said output signal from said phase difference measurement circuit means represents a phase difference which lies outside said predetermined range, said first and second output signals from said phase inversion control circuit means being applied to control the operation of said phase inverter circuit means, said phase inverter circuit means being responsive to said first phase inversion contrl signal for performing phase inversion of said second AC signal and transferring the resultant inverted signal to be produced as said output signal therefrom, and being responsive to said second phase inversion control signal for transferring said second AC signal directly without change in phase to be produced as said output signal therefrom; and operation processing circuit means coupled to receive said first and second phase inversion control signals from said phase inversion control circuit means and said output signal from said phase difference measurement circuit means, and responsive to said second phase inversion control signal for producing an output signal corresponding to said phase difference measurement circuit means output signal, representing the phase difference between said first and second output signals, and responsive to said first phase inversion control signal for modifying said phase difference measurement circuit means output signal in a manner such as to compensate for said phase inversion produced by said phase inverter circuit means, to thereby produce an output signal correctly representing the phase difference between said first and second AC signals.

2. A phase detector according to claim 1, in which said phase difference measurement circuit means comprise:

circuit means for producing a first train of pulses, each of said pulses being initiated when a rising portion of said first AC signal rises above a predetermined threshold level and being terminated when an immediately succeeding rising portion of said output signal from said phase inverter circuit means rises above said threshold level;

circuit means for producing a second train of pulses, each of said pulses being initiated when a falling portion of said first AC signal falls below said threshold level and being terminated when an immediately succeeding falling portion of said output signal from said phase inverter circuit means falls below said threshold level; and circuit means for smoothing and adding said first and second trains of pulses, to thereby produce an output voltage whose level varies in proportion to the phase difference between said first AC signal and said output signal from said phase inverter circuit means.

3. A phase detector for measuring a phase difference between a first AC signal and a second AC signal, comprising:

phase inverter circuit means coupled to receive said second AC signal, for producing an output signal;

phase difference measurement circuit means coupled to receive said first AC signal and said output signal from said phase inverter circuit means, operable to produce an output signal having a magnitude which represents the phase difference between said first AC signal and said output signal from said phase inverter circuit means;

phase inversion control circuit means coupled to receive said output signal from said phase difference measurement circuit means, for producing a first phase inversion control signal if the magnitude of said phase difference measurement circuit means output signal represents a phase difference which lies outside a predetermined range of phase differences which ranges between a primary phase difference value being greater than 0° by a fixed value and a secondary phase difference value of 180°, or if the magnitude of said phase difference measurement circuit means output signal represents a predetermined secondary phase difference value, where said secondary phase difference value differs by 180° with respect to said primary phase difference value, and further for producing a second phase inversion control signal if the magnitude of said phase difference measurement circuit means output signal represents a phase difference which lies within a range of values extending from a value equal to said primary phase difference to a value equal to said secondary phase difference value;

said first and second phase inversion control signals being applied to control the operation of said phase inverter circuit means, said phase inverter circuit means being responsive to said first phase inversion control signal for performing phase inversion of said second AC signal and producing the resultant phase inverted signal as said output signal therefrom, and being responsive to said second phase inversion control signal for transferring said second AC signal directly, without alteration of the phase thereof, to be produced as said output signal therefrom, said phase difference measurement circuit means thereby producing an output signal representing the phase difference between said two AC signals while said second phase inversion control signal is being produced, and producing an output signal representing the phase difference between said first AC signal and the phase-inverted form of said second AC signal while said first phase inversion control signal is being produced; and operation processing circuit means coupled to receive said first and second phase inversion control signals from said phase inversion control circuit means and said output signal from said phase difference measurement circuit means and responsive to said second phase inversion control signal for producing an output signal corresponding to said phase difference measurement circuit means output signal, representing the phase difference between said first and second output signals, and responsive to said first phase inversion control signal for modifying said phase difference measurement circuit means output signal in a manner so as to compensate for said phase inversion produced by said phase inverter circuit means, to thereby produce an output signal correctly representing the phase difference between said first and second AC signals.

4. A phase detector according to claim 3, wherein said operation processing circuit means is coupled to receive said output signal from said phase difference measurement circuit means and said first and second control signals from said phase inversion control circuit means, and is responsive to said second phase control signal for transferring said output signal from said phase difference measurement circuit means directly to an output terminal thereof, and moreover is responsive to said first phase inversion control signal for operating upon said phase difference measurement circuit means output signal such as to compensate for the effect of phase inversion of said second AC signal upon said phase difference measurement circuit means output signal, to thereby produce an output signal from said output terminal thereof correctly representing the phase difference between said first and second AC signals while said phase inversion of said second AC signal is being performed, whereby the output signal from said operation processing circuit means indicates the value of phase difference between said first and second AC signals over a range of 360°.

5. A phase detector according to claim 4, in which the output signal from said phase difference measurement circuit means is a voltage whose level varies in proportion to the absolute value of said phase difference between said first and second AC signals, and in which said operation processing circuit means acts to transfer said phase difference measurement circuit means directly to said output terminal thereof if said second phase inversion control signal is being produced while the output signal from said phase difference measurement circuit means represents a phase difference of less than 180°, and furthermore acts to subtract an amount corresponding to 360° from said phase difference measurement circuit means output signal and transfer the resultant signal to said output terminal thereof if said second phase inversion control signal is being produced while said phase difference measurement circuit means represents a phase difference which is greater than or equal to 180°, and moreover acts to subtract an amount corresponding to 180° from said phase difference measurement circuit means output signal and transfer the resultant signal to said output terminal thereof if said first phase inversion control signal is being produced, whereby an output signal is produced from said output terminal of said operation processing circuit means which varies in linear proportion to the phase difference between said first and second AC signals over a range from −180° to +180°.

* * * * *